(12) United States Patent
Xia

(10) Patent No.: US 10,804,342 B1
(45) Date of Patent: Oct. 13, 2020

(54) DISPLAY PANEL AND PREPARATION METHOD THEREFOR, AND DISPLAY DEVICE

(71) Applicant: WUHAN CHINA STAR OPTOELECTRONICS SEMICONDUCTOR DISPLAY TECHNOLOGY CO., LTD., Wuhan, Hubei (CN)

(72) Inventor: Chen Xia, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 16/341,900

(22) PCT Filed: Apr. 2, 2019

(86) PCT No.: PCT/CN2019/081090
§ 371 (c)(1),
(2) Date: Apr. 14, 2019

(87) PCT Pub. No.: WO2020/124864
PCT Pub. Date: Jun. 25, 2020

(30) Foreign Application Priority Data

Dec. 18, 2018 (CN) .......................... 2018 1 1547022

(51) Int. Cl.
*H01L 27/32* (2006.01)
*H01L 51/56* (2006.01)
*H01L 51/52* (2006.01)

(52) U.S. Cl.
CPC ...... *H01L 27/3244* (2013.01); *H01L 51/5253* (2013.01); *H01L 51/56* (2013.01); *H01L 2227/323* (2013.01)

(58) Field of Classification Search
CPC . H01L 27/3244; H01L 51/56; H01L 51/5253; H01L 2227/323
See application file for complete search history.

(56) References Cited

U.S. PATENT DOCUMENTS 7,446,473 B2 * 11/2008 Tanaka ................ H01L 51/5243
313/506
7,608,997 B2 * 10/2009 Tanaka ................ H01L 51/5259
313/498

(Continued)

FOREIGN PATENT DOCUMENTS

CN 103681906 A 3/2014
CN 104183783 A 12/2014

(Continued)

*Primary Examiner* — Victor A Mandala
(74) *Attorney, Agent, or Firm* — Mark M. Friedman

(57) ABSTRACT

A display panel and a preparation method therefor, and a display device are disclosed. The display panel includes a first base layer; a barrier layer, disposed on the first base layer; a second base layer, disposed on the barrier layer; a first high-temperature-resistant adhesive layer, configured to adhere the first base layer to the barrier layer; and a second high-temperature-resistant adhesive layer, configured to adhere the barrier layer to the second base layer. Beneficial effects: An inorganic high-temperature-resistant adhesive layer is coated between the base layer and the barrier layer, so that the base layer can be adhered to the barrier layer more firmly, to improve bending performance of the base layer, and reduce a risk of a fracture between the base layer and the barrier layer, thereby improving a bending capability of the flexible display panel, and improving a product yield, controllability, and endurance.

13 Claims, 3 Drawing Sheets

(56) References Cited

U.S. PATENT DOCUMENTS

| | | | |
|---|---|---|---|
| 2012/0086100 A1* | 4/2012 | Andry | H01L 21/6835 |
| | | | 257/506 |
| 2014/0346473 A1 | 11/2014 | Park et al. | |
| 2016/0111485 A1* | 4/2016 | Chida | H01L 27/3262 |
| | | | 257/40 |
| 2016/0155984 A1* | 6/2016 | Yamazaki | H01L 27/3244 |
| | | | 257/40 |
| 2017/0166786 A1* | 6/2017 | Moon | C09J 7/385 |
| 2017/0323779 A1* | 11/2017 | Um | H01L 27/1262 |
| 2017/0352834 A1* | 12/2017 | Kim | H01L 27/3276 |
| 2018/0033980 A1* | 2/2018 | Park | H01L 51/0533 |
| 2018/0183002 A1* | 6/2018 | Kawata | B32B 3/08 |
| 2018/0269426 A1* | 9/2018 | Okamoto | H01L 51/5253 |
| 2019/0119811 A1 | 4/2019 | Wang | |
| 2019/0131363 A1* | 5/2019 | Xie | H01L 27/3244 |
| 2019/0131551 A1 | 5/2019 | Xie | |
| 2019/0273212 A1* | 9/2019 | Shin | H01L 51/5253 |
| 2020/0006685 A1 | 1/2020 | Xie | |

FOREIGN PATENT DOCUMENTS

| | | |
|---|---|---|
| CN | 107680994 A | 2/2018 |
| CN | 107818990 A | 3/2018 |
| CN | 107871822 A | 4/2018 |

\* cited by examiner

DISPLAY PANEL AND PREPARATION METHOD THEREFOR, AND DISPLAY DEVICE

FIELD OF INVENTION

The present invention relates to the display field, and in particular, to a display panel and a preparation method therefor, and a display device.

BACKGROUND OF INVENTION

An organic light-emitting diode (OLED) display panel has such advantages as self-illumination, high contrast, a small thickness, a wide viewing angle, and a high response speed, is the representative of a new-generation plane display technology, and is increasingly praised highly by the industry. A flexible OLED display panel is one of the important development trends.

A flexible OLED display panel is lighter and thinner, and can reduce power consumption, thereby helping improve a battery life of a corresponding product. In addition, because of bendability and flexibility of the flexible OLED display panel, the flexible OLED display panel is also more durable than an ordinary hard display panel. Flexible OLED display panels can be widely applied to products having a display function, such as tablet computers, televisions, mobile terminals, and a wide range of wearable devices.

With development of display technologies, there are increasingly high requirements on a color and lightness, and a flexible OLED display is gradually entering the consumer electronic market of mobile devices, televisions, and the like. As a flexible display, a base layer prepared by using polyimide (PI) as a main component is a flexible substrate of a thin film transistor (TFT) structure and an OLED structure. However, a poor capability of the base layer to block oxygen ($O_2$) and water ($H_2O$) causes a part of water or oxygen to pass through the base layer into a circuit of the TFT structure, and affects a service life of OLED light-emitting materials.

In recent years, an OLED display technology has developed rapidly, and OLED products have gained more attention and are more widely applied because of such advantages as a light and thin body, a fast response, a wide viewing angle, high contrast, and flexibility, and are mainly applied to mobile phones, tablet computers, televisions, and other display fields.

A flexible OLED display panel device includes a PI flexible layer, a TFT drive layer, an OLED light-emitting layer, a thin film encapsulation (TFE) layer, and the like from bottom to top. A luminescence principle of an OLED is to deposit an OLED light-emitting layer between two electrodes, galvanize the OLED light-emitting layer, and implement luminescence through carrier injection and compounding. In a flexible OLED display technology, PI is usually used to replace a conventional glass substrate to implement foldable and flexible display. To implement better bending and water and oxygen barrier performance, double-layer PI is usually used to replace single-layer PI, namely, a PI-silicon and nitride-PI structure. However, due to relatively poor adhesiveness between organic PI and inorganic silicon nitride, the double-layer PI structure is prone to a fracture between PI and silicon nitride film layers during bending, causing water and oxygen intrusion into the OLED display panel, causing an oxidation failure of the OLED light-emitting layer, and reducing product tolerance.

Technical Problem

To resolve the foregoing technical problem, the present invention provides a display panel and a preparation method therefor, and a display device, to resolve a prior-art problem that during bending, a base layer is easily separated from a barrier layer in the display panel, causing water and oxygen intrusion and causing a failure of a light-emitting layer in the display panel.

SUMMARY OF INVENTION

A technical solution to solve the foregoing problem is as follows: The present invention provides a display panel, including a first base layer; a barrier layer, disposed on the first base layer; a second base layer, disposed on the barrier layer; a first high-temperature-resistant adhesive layer, configured to adhere the first base layer to the barrier layer; and a second high-temperature-resistant adhesive layer, configured to adhere the barrier layer to the second base layer.

Further, the display panel further includes a TFT structural layer, disposed on the second base layer; an OLED, disposed on the TFT structural layer; and a TFE layer, configured to package TFT structural layer and the OLED.

Further, the barrier layer is a single-layer structure of a silica layer, or a single-layer structure of a silicon nitride layer, or a multi-layer structure in which silica layers and silicon nitride layers are alternately disposed. Materials used for the first base layer and the second base layer are PI.

Further, materials of the first high-temperature-resistant adhesive layer and the second high-temperature-resistant adhesive layer are inorganic nanometer materials, including at least one of inorganic copper oxide, inorganic silicate, inorganic phosphate, and inorganic acid salt.

Further, a melting point of each of the first high-temperature-resistant adhesive layer and the second high-temperature-resistant adhesive layer are 500° C. to 1300° C.

Further, a thickness of the barrier layer is 0.1 µm to 1.0 µm. Thicknesses of the first base layer and the second base layer are 5 µm to 15 µm. Thicknesses of the first high-temperature-resistant adhesive layer and the second high-temperature-resistant adhesive layer are 0.1 µm to 1.0 µm.

The present invention further provides a method for preparing a display panel, including the following steps: (S1) providing a substrate; (S2) forming a first base layer on the substrate; (S3) coating or spraying a high-temperature-resistant adhesive on the first base layer, to form a first high-temperature-resistant adhesive layer; (S4) forming a barrier layer on the first high-temperature-resistant adhesive layer; (S5) coating or spraying a high-temperature-resistant adhesive on the barrier layer, to form a second high-temperature-resistant adhesive layer; and (S6) forming a second base layer on the second high-temperature-resistant adhesive layer.

Further, after step (S6), the method further includes the following steps: (S7) forming a TFT structural layer on the second base layer; (S8) correspondingly forming an OLED on the TFT structural layer; (S9) forming a packaging layer for packaging the TFT structural layer and the OLED; and (S10) removing the substrate.

Further, in step (S2), a PI material is coated on the substrate, to form the first base layer after defoaming and curing; and in step (S6), a PI material is coated on the barrier layer, to form the second base layer after defoaming and curing.

The present invention further provides a display device, including the display panel.

Beneficial Effect

The present invention provides the display panel and the preparation method therefor, and the display device. An inorganic high-temperature-resistant adhesive layer is coated between the first base layer and the barrier layer, and between the second base layer and the barrier layer, so that the base layer can be adhered to the barrier layer more firmly, to improve bending performance of the base layer, and reduce a risk of a fracture between the base layer and the barrier layer, thereby improving a bending capability of the flexible display panel, and improving a product yield, controllability, and endurance.

BRIEF DESCRIPTION OF DRAWINGS

To describe the technical solutions in the embodiments of the present invention more clearly, the following briefly describes the accompanying drawings required for describing the embodiments. Apparently, the accompanying drawings in the following description show merely some embodiments of the present invention, and a person skilled in the art may still derive other drawings from these accompanying drawings without creative efforts.

REFERENCE NUMERALS

Figure 1:
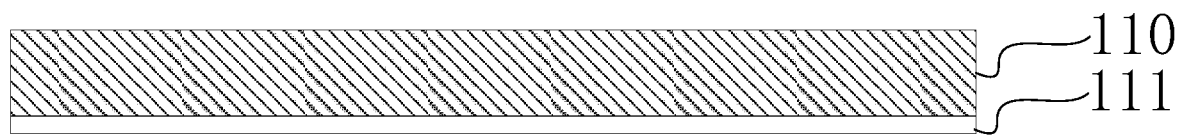
FIG. 1 is a schematic diagram of forming a first base layer in a method for preparing a display panel according to an embodiment.

1: Display device
10: Display panel
110: First base layer 120: Barrier layer
130: Second base layer 140: High-temperature-resistant adhesive layer
1410: First high-temperature-resistant adhesive layer 1420: Second high-temperature-resistant adhesive layer
150: TFT structural layer 160: OLED 170: TFE layer 111: Substrate

DETAILED DESCRIPTION OF PREFERRED EMBODIMENTS

The following embodiments are described with reference to the accompanying drawings, and are used to exemplify specific embodiments for implementation of the present invention. Terms about directions mentioned in the present invention, such as "upper", "lower", "front", "rear", "left", "right", "top", and "bottom" merely refer to directions in the accompanying drawings. Therefore, the used terms about directions are used to describe and understand the present invention, and are not intended to limit the present invention.

Embodiment

Figure 6:
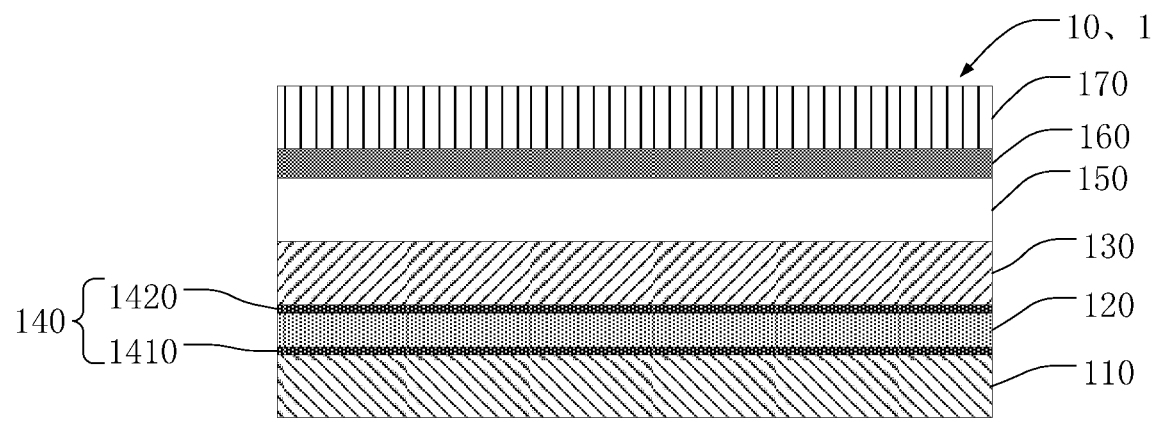
FIG. 6 is a schematic diagram of a display panel and a display device according to an embodiment.

As shown in FIG. 6, in the present embodiment, a display panel 10 in the present invention includes a first base layer 110, a barrier layer 120, a second base layer 130, high-temperature-resistant adhesive layer 140, a TFT structural layer 150, an OLED 160, and a TFE layer 170.

Materials used for the first base layer 110 and the second base layer 130 are PI. The barrier layer 120 is disposed between the first base layer 110 and the second base layer 130. The barrier layer 120 may be prepared by a silica (SiO2) material, or may be prepared by a silicon nitride (SiNx) material. Thicknesses of the first base layer 110 and the second base layer 130 are 5 μm to 15 μm. A thickness of the barrier layer 120 is 0.1 μm to 2.0 μm, and specifically, may be 0.2 μm, or 0.5 μm, or 1.1 μm, or 1.9 μm.

In the present embodiment, the barrier layer may be a single-layer silica layer, or may be a single-layer silicon nitride layer, or certainly, may be a multi-layer structure in which silica layers and silicon nitride layers are alternately disposed.

In the multi-layer structure of the barrier layer 120, an arrangement form of the silica layers and the silicon nitride layers may be written as A-B-A-B-A-B- . . . , namely, (AB)n, where n is an integer greater than or equal to 1, A indicates the silica layer, and B indicates the silicon nitride layer. The barrier layer 120 of the multi-layer structure can extend a penetration path of water and oxygen and has a better capability of blocking steam and oxygen.

In a specific implementation of the present invention, in comparison with a flexible substrate prepared by using a separate PI flexible substrate or another organic polymer material, a composite substrate structure formed by the first base layer 110, the barrier layer 120, and the second base layer 130 has the following features: On one hand, the composite substrate structure formed by the first base layer 110, the barrier layer 120, and the second base layer 130 has good performance of blocking water and oxygen, thereby greatly reducing a probability that water and oxygen pass through the flexible substrate, protecting the TFT structural layer and an OLED structure, and prolonging a service life of an OLED display panel. On the other hand, the composite flexible substrate structure also has good flexibility, and can be widely applied to preparing flexible panels.

However, because adhesiveness between the first base layer 110 and the barrier layer 120, and adhesiveness between the barrier layer 120 and the second base layer 130 are relatively poor, during bending, a fracture easily occurs, causing water and oxygen intrusion, and causing an oxidation failure of a light-emitting layer of the display panel 10. In the present embodiment, one high-temperature-resistant adhesive layer 140 is added between the first base layer 110 and the barrier layer 120, and between the barrier layer 120 and the second base layer 130. Specifically, the high-temperature-resistant adhesive layer 140 includes a first high-temperature-resistant adhesive layer 1410 and a second high-temperature-resistant adhesive layer 1420. The first high-temperature-resistant adhesive layer 1410 is configured to adhere the first base layer 110 to the barrier layer 120. The second high-temperature-resistant adhesive layer 1420 is configured to adhere the barrier layer 120 to the second base layer 130. The high-temperature-resistant adhesive layer 140 has relatively strong adhesiveness, and a thickness of 0.1 μm to 1.0 μm, which may be specifically 0.3 μm, 0.5 μm, 0.7 μm, or 0.9 μm, and can withstand a high temperature of 500° C. to 1300° C. and more. That is, a melting point of the high-temperature-resistant adhesive layer 140 is at least 500° C. to 1300° C. The high-temperature-resistant adhesive layer 140 can maintain an excellent adhering function and erosion-resistance at a high temperature, and a material thereof is an inorganic nanometer composite adhesive that is specifically at least one of an inorganic copper oxide material, an inorganic silicate material, an inorganic phosphate material, and an inorganic sulfate material.

The TFT structural layer 150 is disposed on the second base layer 130. The OLED 160 is disposed on the TFT structural layer 150. The TFE layer 170 packages the OLED 160 and the TFT structural layer 150.

To more clearly explain the display panel of the present invention, the present invention is further described below with reference to a method for preparing a display panel.

Figure 7:
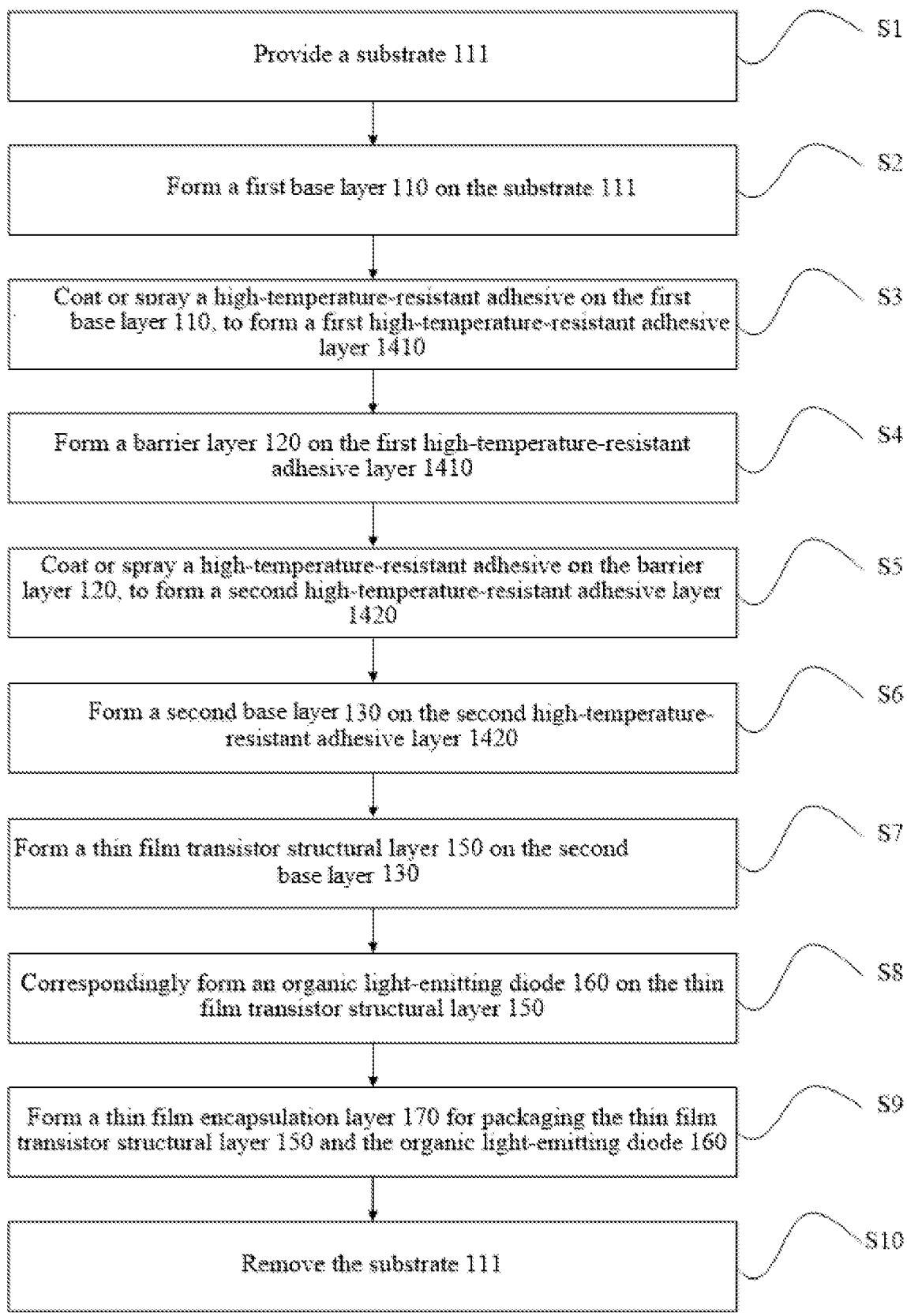
FIG. 7 is a schematic flowchart of a method for preparing a display panel according to an embodiment.

As shown in FIG. 7, a method for preparing a display panel of the present invention includes step (S1) to step (S10):

(S1) Provide a substrate 111. In the present embodiment, the substrate 111 selects a glass substrate.

(S2) Form a first base layer 110 on the substrate 111. As shown in FIG. 1, in the present embodiment, a PI material is coated on the substrate 111, to form the first base layer 110 after defoaming and curing.

Figure 2:
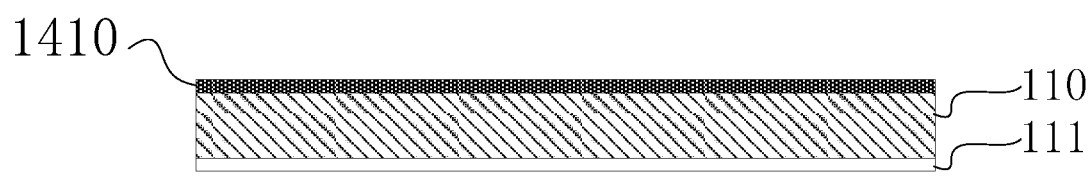
FIG. 2 is a schematic diagram of forming a first high-temperature-resistant adhesive layer in a method for preparing a display panel according to an embodiment.

(S3) As shown in FIG. 2, coat or spray a high-temperature-resistant adhesive on the first base layer 110, to form a first high-temperature-resistant adhesive layer 1410.

Figure 3:
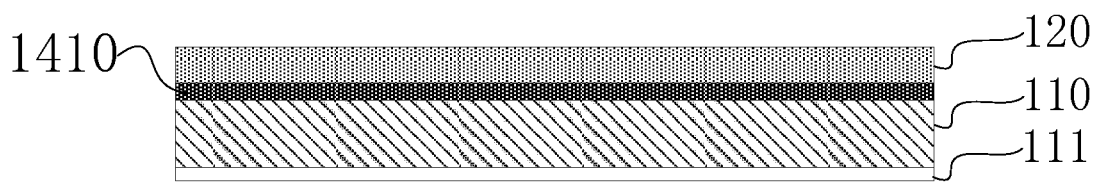
FIG. 3 is a schematic diagram of forming a barrier layer in a method for preparing a display panel according to an embodiment.

(S4) As shown in FIG. 3, form a barrier layer 120 on the first high-temperature-resistant adhesive layer 1410. In the present embodiment, a PI material is coated on the barrier layer 120, to form a second base layer 130 after defoaming and curing.

Figure 4:
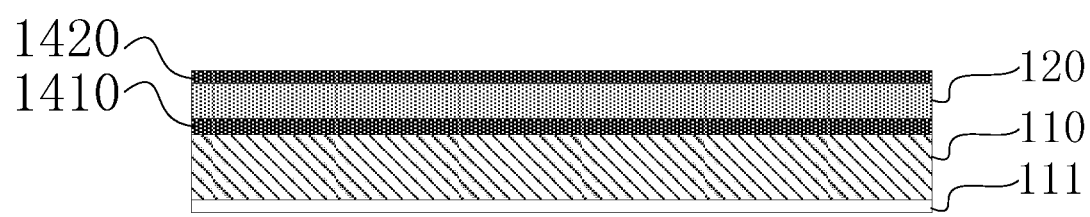
FIG. 4 is a schematic diagram of forming a second high-temperature-resistant adhesive layer in a method for preparing a display panel according to an embodiment.

(S5) As shown in FIG. 4, coat or spray a high-temperature-resistant adhesive on the barrier layer 120, to form a second high-temperature-resistant adhesive layer 1420.

Figure 5:
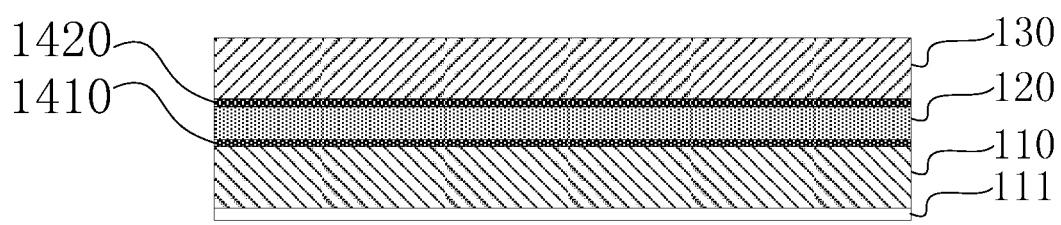
FIG. 5 is a schematic diagram of forming a second base layer in a method for preparing a display panel according to an embodiment.

(S6) As shown in FIG. 5, form the second base layer 130 on the second high-temperature-resistant adhesive layer 1420.

(S7) Form a TFT structural layer 150 on the second base layer 130.

(S8) Correspondingly form an OLED 160 on the TFT structural layer 150.

(S9) Form a TFE layer 170 for packaging the TFT structural layer 150 and the OLED 160.

(S10) Remove the substrate 111.

The present invention further provides a display device 1. A main improvement and a feature of the display device are both revealed by the display panel 10. For other components of the display device, details are not described one by one.

The above descriptions are merely preferred embodiments of the present invention, but are not intended to limit the present invention. Any modification, equivalent replacement, and improvement made without departing from the spirit and principle of the present invention shall fall within the protection scope of the present invention.

What is claimed is:

1. A display panel, comprising:
   a first base layer;
   a barrier layer, disposed on the first base layer;
   a second base layer, disposed on the barrier layer;
   a first high-temperature-resistant adhesive layer, configured to adhere the first base layer to the barrier layer; and
   a second high-temperature-resistant adhesive layer, configured to adhere the barrier layer to the second base layer;
   wherein melting points of the first high-temperature-resistant adhesive layer and the second high-temperature-resistant adhesive layer are 500° C. to 1300° C.

2. The display panel according to claim 1, further comprising
   a thin film transistor (TFT) structural layer, disposed on the second base layer;
   an organic light-emitting diode (OLED), disposed on the TFT structural layer; and
   a thin film encapsulation (TFE) layer, configured to package the TFT structural layer and the OLED.

3. The display panel according to claim 1, wherein
   the barrier layer is a single-layer structure of a silica layer, or a single-layer structure of a silicon nitride layer, or a multi-layer structure in which silica layers and silicon nitride layers are alternately disposed; and
   materials used for the first base layer and the second base layer are polyimide (PI).

4. The display panel according to claim 1, wherein
   materials of the first high-temperature-resistant adhesive layer and the second high-temperature-resistant adhesive layer are inorganic nanometer materials, comprising at least one of inorganic copper oxide, inorganic silicate, inorganic phosphate, and inorganic acid salt.

5. The display panel according to claim 1, wherein
   a thickness of the barrier layer is 0.1 μm to 1.0 μm;
   thicknesses of the first base layer and the second base layer are 5 μm to 15 μm; and
   thicknesses of the first high-temperature-resistant adhesive layer and the second high-temperature-resistant adhesive layer are 0.1 μm to 1.0 μm.

6. A method for preparing a display panel, comprising the following steps:
   (S1) providing a substrate;
   (S2) forming a first base layer on the substrate;
   (S3) coating or spraying a high-temperature-resistant adhesive on the first base layer, to form a first high-temperature-resistant adhesive layer;
   (S4) forming a barrier layer on the first high-temperature-resistant adhesive layer;
   (S5) coating or spraying a high-temperature-resistant adhesive on the barrier layer, to form a second high-temperature-resistant adhesive layer; and
   (S6) forming a second base layer on the second high-temperature-resistant adhesive layer;
   wherein melting points of the first high-temperature-resistant adhesive layer and the second high-temperature-resistant adhesive layer are 500° C. to 1300° C.

7. The method for preparing a display panel according to claim 6, wherein after step (S6), the method further comprises the following steps:
   (S7) forming a thin film transistor (TFT) structural layer on the second base layer;
   (S8) correspondingly forming an organic light-emitting diode (OLED) on the TFT structural layer;
   (S9) forming a thin film encapsulation (TFE) layer for packaging the TFT structural layer and the OLED; and
   (S10) removing the substrate.

8. The method for preparing a display panel according to claim 6, wherein in step (S2), a polyimide (PI) material is coated on the substrate, to form the first base layer after defoaming and curing; and in step (S6), a PI material is coated on the barrier layer, to form the second base layer after defoaming and curing.

9. A display device, comprising the display panel according to claim 1.

10. The display device according to claim 9, further comprising:
   a thin film transistor (TFT) structural layer, disposed on the second base layer;
   an organic light-emitting diode (OLED), disposed on the TFT structural layer; and
   a thin film encapsulation (TFE) layer, configured to package the TFT structural layer and the OLED.

11. The display device according to claim 9, wherein
   the barrier layer is a single-layer structure of a silica layer, or a single-layer structure of a silicon nitride layer, or a multi-layer structure in which silica layers and silicon nitride layers are alternately disposed; and
   materials used for the first base layer and the second base layer are polyimide (PI).

12. The display device according to claim 9, wherein
   materials of the first high-temperature-resistant adhesive layer and the second high-temperature-resistant adhesive layer are inorganic nanometer materials, comprising at least one of inorganic copper oxide, inorganic silicate, inorganic phosphate, and inorganic acid salt.

13. The display device according to claim 9, wherein
   a thickness of the barrier layer is 0.1 μm to 1.0 μm;
   thicknesses of the first base layer and the second base layer are 5 μm to 15 μm; and
   thicknesses of the first high-temperature-resistant adhesive layer and the second high-temperature-resistant adhesive layer are 0.1 μm to 1.0 μm.

* * * * *